(12) United States Patent
Tsuruko

(10) Patent No.: US 8,349,409 B2
(45) Date of Patent: Jan. 8, 2013

(54) PATTERN FORMING METHOD, METHOD FOR FORMING COMPOSITE-METAL OXIDE FILM AND METHOD FOR COATING TWO-LIQUID REACTION CURING TYPE ADHESIVE

(75) Inventor: Masanori Tsuruko, Nagoya (JP)

(73) Assignee: Brother Kogyo Kabushiki Kaisha, Aichi-Ken (JP)

( * ) Notice: Subject to any disclaimer, the term of this patent is extended or adjusted under 35 U.S.C. 154(b) by 1084 days.

(21) Appl. No.: 11/700,375

(22) Filed: Jan. 31, 2007

(65) Prior Publication Data

US 2007/0176960 A1    Aug. 2, 2007

(30) Foreign Application Priority Data

Jan. 31, 2006   (JP) .................................. 2006-022771

(51) Int. Cl.
*B05D 1/40* (2006.01)
(52) U.S. Cl. ..................... 427/480; 427/419.2; 427/584; 347/12; 347/39
(58) Field of Classification Search .................. 427/256, 427/480, 584; 347/12, 39
See application file for complete search history.

(56) References Cited

U.S. PATENT DOCUMENTS

| | | | | |
|---|---|---|---|---|
| 5,236,523 A | * | 8/1993 | Shibata | 148/431 |
| 5,500,142 A | * | 3/1996 | Ushida et al. | 252/62.9 R |
| 6,254,847 B1 | * | 7/2001 | Kurisu et al. | 423/594.4 |
| 6,255,242 B1 | * | 7/2001 | Umemoto et al. | 501/103 |
| 6,326,329 B1 | * | 12/2001 | Nunan | 502/242 |
| 6,538,047 B1 | | 3/2003 | Miyabayashi | |
| 6,607,845 B2 | | 8/2003 | Hirai et al. | |
| 2002/0054999 A1 | * | 5/2002 | Kessell | 428/447 |
| 2002/0151161 A1 | * | 10/2002 | Furusawa | 438/597 |
| 2004/0094865 A1 | * | 5/2004 | Mellentine et al. | 264/240 |
| 2004/0229031 A1 | * | 11/2004 | Gell et al. | 428/323 |
| 2006/0012622 A1 | * | 1/2006 | Kusunoki | 347/12 |
| 2006/0019042 A1 | * | 1/2006 | Nojima et al. | 428/32.24 |

FOREIGN PATENT DOCUMENTS

| | | |
|---|---|---|
| JP | 9309705 | 12/1997 |
| JP | 11138672 | 5/1999 |
| JP | 2000-015161 | 1/2000 |
| JP | 2002-114519 | 4/2002 |
| JP | 2002-184034 | 6/2002 |
| JP | 2002-1616223 | 6/2002 |
| JP | 2005-005012 | 1/2005 |
| JP | 2005-216605 | 8/2005 |

* cited by examiner

*Primary Examiner* — Michael Cleveland
*Assistant Examiner* — Xiao Zhao
(74) *Attorney, Agent, or Firm* — Frommer Lawrence & Haug LLP

(57) ABSTRACT

A liquid droplet of a first liquid and a liquid droplet of a second liquid are mixed upon landing on a substrate, and then the reaction is initiated between the first and second liquid droplets. Accordingly, it is possible to avoid the problem which would have been caused when the two liquids are mixed in advance before the usage that the reaction between the two liquids is advanced before the liquids are actually coated. Further, since the ink-jet system is employed, it is possible to precisely control the liquid-droplet amount and the landing position, thereby landing the first and second liquids on a same position with high precision. Accordingly, a highly integrated pattern can be formed. Furthermore, since the mixing ratio of the first and second liquids can be precisely controlled, the film quality can be stabilized.

12 Claims, 10 Drawing Sheets

PATTERN FORMING METHOD, METHOD FOR FORMING COMPOSITE-METAL OXIDE FILM AND METHOD FOR COATING TWO-LIQUID REACTION CURING TYPE ADHESIVE

CROSS REFERENCE TO RELATED APPLICATION

The present application claims priority from Japanese Patent Application No. 2006-022771 filed on Jan. 31, 2006, the disclosure of which is incorporated herein by reference in its entirety.

BACKGROUND OF THE INVENTION

1. Field of the Invention

The present invention relates to a pattern forming method, a method for forming a composite metal-oxide film, and a method for coating two-liquid reaction curing type adhesive.

2. Description of the Related Art

For example, Japanese Patent Application Laid-open No. 09-309705 describes a technique for using nano-particles of a composite metal oxide as a dielectric material. Since such fine particles with a nano-scale particle size have a very small particle size and a high surface activity, the fine particles exhibit a property different from the physical property inherent to the compound itself. In particular, it is known that the fine particles can be calcinated at a low temperature of about 300° C. to 400° C. Thus, it is expected to apply the fine particles to, for example, a substrate of condenser-built in type in which a condenser is integrally built in an insulator such as a resin constructing a circuit board.

The nano-particles, however, have a property that the particles mutually interact very highly and are easily aggregated. It is therefore difficult to handle the nano-particles, and there has been no example in which the nano-particles were applied to form, for example, a part or component for a highly integrated LSI board.

As a method for easily obtaining such nano-particles of the composite metal oxide, there is a method employing the coprecipitation method. The coprecipitation method is a method in which a precipitant and a several kinds of salts of metals (metal salts) forming a composite metal oxide are reacted in a liquid phase to thereby generate a coprecipitate; and then the obtained coprecipitate is calcinated, thereby obtaining a target compound.

Accordingly, it is conceivable that a solution, obtained by mixing metal salts and a precipitant just before the mixture solution is used, is coated on a base material in a desired pattern form to generate a coprecipitate on the base material, and then the generated coprecipitate is calcinated on the base material, thereby forming a composite-metal oxide film on the base material.

In this case, however, the reaction between the metal salts and the precipitant is advanced also during a period of time since the metal salts and the precipitant have been mixed and then to the mixture of the metal salts and precipitant is coated on the base material. Therefore, when the solution is made to be a high-concentration solution, the coprecipitate is aggregated and deposited, thereby lowering the dispersion stability. On the other hand, when the solution is made to be a low-concentration solution for the purpose of improving the dispersion stability, then a coating operation needs to be performed repeatedly so as to obtain a composite metal-oxide film of a target thickness, thereby lowering the producibility.

SUMMARY OF THE INVENTION

An object of the present invention is to provide a method suitable for forming a highly integrated pattern by using two kinds of liquids in which the reaction therebetween is initiated by being mixed. Note that reference numerals in parentheses, affixed to elements indicated below, respectively, are mere examples for the elements, and are not intended to limit the elements.

According to a first aspect of the present invention, there is provided a method for forming a pattern on a base material (10) by using a liquid-droplet jetting (discharging) apparatus (1) of an ink-jet type having a first nozzle (6A) and a second nozzle (6B), the method including: a first liquid jetting step (S11) for jetting a first liquid (L1) from the first nozzle (6A) to land the first liquid (L1) onto the base material (10); and a second liquid jetting step (S12) for jetting a second liquid (L2) which reacts with the first liquid (L1) from the second nozzle (6B) to land the second liquid (L2) on the base material at a same position as a landing position at which the first liquid (L1) has been landed in the first liquid jetting step (S11).

In the present invention, the first liquid (L1) and the second liquid (L2) are mixed upon landing onto the base material (10), and then the reaction between the first and second liquids is initiated. Accordingly, for example, when a thick film is to be obtained, there arises no problem which would have been caused by mixing the two liquids in advance before the jetting such that coprecipitate is aggregated and deposited during a period of time after the mixing until the coating to thereby lower the dispersion stability. In addition, it is also possible to avoid the problem which would have been caused by mixing and using two low-concentration liquids for the purpose of improving the dispersion stability that the number of times of coating is increased which in turn lowers the producibility. Further, when a time interval between the mixing of the two liquids (L1, L2) and the usage of the liquids are long, it is necessary to preserve the liquids at a very low temperature so as to inhibit the advancement of reaction and/or the two liquids are made to be low-concentration liquids. The present invention, however, does not mix the two liquids (L1, L2) until just before the liquids are landed on the base material (10), thereby eliminating any storage cost. Furthermore, when it is desired to form a film having a great thickness, high-concentration liquids can be used as appropriate. Moreover, since the present invention employs the ink-jet system for landing liquid droplets of the liquids on the base material (10), it is possible to precisely control the liquid-droplet volume and the landing position, thereby making it possible to form a highly integrated pattern by landing the first and second liquid (L1, L2) on the same position with high precision.

The method for forming the pattern of the present invention may include, before the first liquid jetting step (S11) and the second liquid jetting step (S12), a surface treatment step (S10) for treating a landing surface, of the base material (10), onto which the first and second liquids (L1, L2) are to be landed. This makes it possible to control contact angles among the landed first and second liquids (L1, L2) and the base material (10) for which the surface treatment has been performed, and to activate the reaction between the first liquid (L1) and the second liquid (L2).

In the method for forming the pattern of the present invention, the first liquid jetting step (S11) and the second liquid jetting step (S12) may be performed concurrently. Alternatively, the first liquid jetting step (S11) and the second liquid jetting step (S12) may be repeated, after the first liquid jetting step (S1) and the second liquid jetting step (S2) have been performed for the landing position, while changing the landing position to other landing positions different from the landing position. In these cases, it is possible to avoid the first or second liquid (L1 or L2), which has been landed, from being decomposing singly after the landing.

According to a second aspect of the present invention, there is provided a method for forming a composite-metal oxide film on a base material (10) by using a liquid-droplet jetting apparatus (1) of an ink-jet type including a first nozzle (6A) and a second nozzle (6B), the method including: a first liquid jetting step (S11) for jetting, from the first nozzle (6A), a first liquid (L1) containing salts of metals forming a composite metal oxide to land the first liquid (L1) on the base material (10); a second liquid jetting step (S12) for jetting, from the second nozzle (6B), a second liquid (L2) containing a precipitant, which reacts with at least one of the metals forming the composite metal oxide to form a coprecipitate, to land the second liquid (L2) on the base material (10) at a same position as a landing position at which the first liquid (L1) has been landed in the first liquid jetting step (S11), mixing the first and second liquids (L1, L2) on the base material 10; and a calcinating step (S13) for calcinating a coprecipitate, generated by the mixing of the first and second liquids (L1, L2), to form the composite-metal oxide film on the base material (10).

In the method for forming the composite-metal oxide film of the present invention, the first and second liquids (L1, L2) are not mixed before the usage, but are mixed upon landing on the base material (10) to initiate the reaction. Accordingly, when it is desired to form a film having a great thickness, high-concentration liquids can be used as appropriate. Further, since the present invention employs the ink-jet system for landing the liquids on the base material (10), it is possible to finely control a mixing ratio of the first and second liquids (L1, L2), thereby stabilizing the film quality.

The method for forming the composite-metal oxide film of the present invention may further include, before the first liquid jetting step (S11) and the second liquid jetting step (S12), a surface treatment step (S10) for enhancing a liquid repellent property on a landing surface, of the base material (10), onto which the first and second liquids (L1, L2) are to be landed. By performing the surface treatment, it is possible to restrict amounts, by which the first and second liquids (L1, L2) wet and spread on the landing surface, to be a predetermined amount, thereby mixing the first and second liquids (L1, L2) assuredly.

In the method for forming the composite-metal oxide film of the present invention, the first liquid jetting step (S11) and the second liquid jetting step (S12) may be performed concurrently. Alternatively, the first liquid jetting step (S11) and the second liquid jetting step (S12) may be repeated, after the first liquid jetting step (S1) and the second liquid jetting step (S2) have been performed for the landing position, while changing the landing position to other landing positions different from the landing position. In these cases, it is possible to avoid the first or second liquid (L1 or L2), which has been landed, from being decomposing singly after the landing.

In the method for forming the composite-metal oxide film of the present invention, the composite-metal oxide film may be a piezoelectric film constructing a piezoelectric actuator. In this case, it is possible to form, easily and highly precisely, a piezoelectric film for the piezoelectric actuator with satisfactory characteristics.

In the method for forming the composite-metal oxide film of the present invention, the composite metal oxide may be lead zirconate titanate; and the second liquid (L2) may include a solution in which ammonium sulfate is dissolved in liquid ammonia. Further, the first liquid (L1) may include aqueous solution of a block copolymer for low-temperature crystallization.

According to a third aspect of the present invention, there is provided a method for coating a two-liquid reaction curing type adhesive on a base material (10) by using a liquid-droplet jetting apparatus (1) of an ink-jet type including a first nozzle (6A) and a second nozzle (6B), the method including: a first liquid jetting step (S11) for jetting a first liquid (L1), containing one of a main agent and a curing agent which form the two-liquid reaction curing type adhesive, from the first nozzle (6A) to land the first liquid (L1) on the base material (10); and a second liquid jetting step (S12) for jetting a second liquid, containing the other of the main agent and the curing agent, from the second nozzle (6B) to land the second liquid (L2) on the base material (10) at a same position as a landing position at which the first liquid (L1) has been landed in the first liquid jetting step (S11).

In the method for coating the two-liquid reaction curing type adhesive of the present invention, the first and second liquids (L1, L2) are not mixed before the usage, but are mixed upon landing on the base material (10) to initiate a curing reaction. Accordingly, the adhesive does not solidify inside the nozzles, and thus there is no need to provide a washing (cleaning) mechanism for cleaning the inside of the nozzles. In addition, the first and second liquids (L1, L2) can be stored without being mixed with each other. Accordingly, there is no restriction such that the liquids need to be used up in one usage. Further, since the present invention employs the ink-jet system for landing liquid droplets of the liquids on the base material (10), it is possible to precisely control the liquid-droplet volume and the landing position, thereby making it possible to form a highly integrated pattern of the adhesive by landing the first and second liquid (L1, L2) on the same position with high precision.

The method for coating the two-liquid reaction curing type adhesive of the present invention may include, before the first liquid jetting step (S11) and the second liquid jetting step (S12), a surface treatment step (S10) for radicalizing a landing surface, of the base material (10), onto which the first and second liquids (L1, L2) are to be landed. By performing the surface treatment for radicalizing the landing surface, it is possible to activate the reaction between the adhesive and the landing surface, thereby enhancing the adhesiveness.

In the method for coating the two-liquid reaction curing type adhesive of the present invention, the first liquid jetting step (S11) and the second liquid jetting step (S12) may be performed concurrently. Alternatively, the first liquid jetting step (S11) and the second liquid jetting step (S12) may be repeated, after the first liquid jetting step (S11) and the second liquid jetting step (S12) have been performed for the landing position, while changing the landing position to other landing positions different from the landing position. In these cases, it is possible to avoid the first or second liquids (L1 or L2), which has been landed, from being decomposing singly after the landing.

DESCRIPTION OF THE PREFERRED EMBODIMENTS

In the following, an embodiment of the present invention will be explained in detail with reference to FIGS. 1 to 6 and FIG. 13. In this embodiment, the present invention is applied to a method for forming a pattern of a composite metal-oxide film on a substrate 10 (base material) for printed circuit board by using a printer 1 (liquid-droplet jetting apparatus of ink-jet type).

Figure 1:
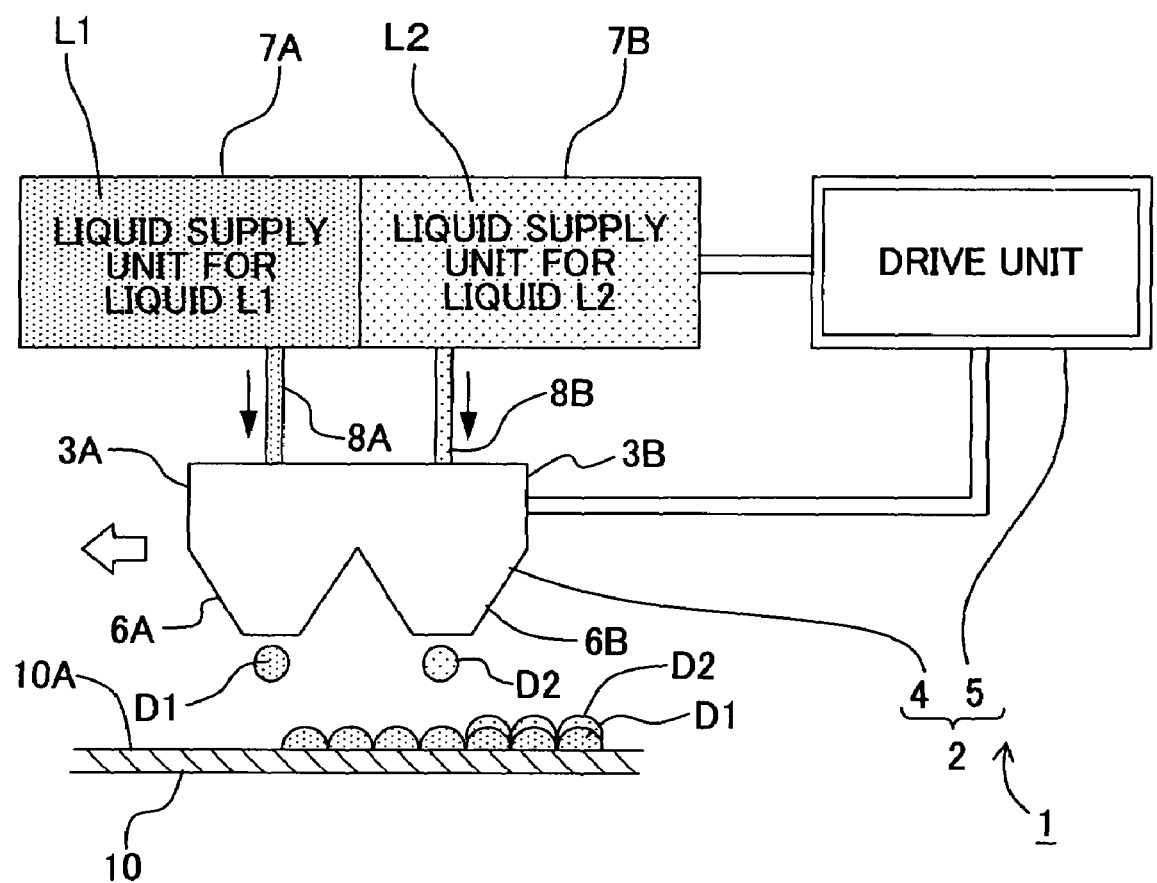
FIG. 1 is a schematic view of a printer used in embodiments of the present invention.

FIG. 1 schematically shows the printer 1 used in the embodiment. The printer 1 performs printing with a mechanism similar to that of a known ink-jet printer, and is provided with a recording unit 2 for performing printing on the substrate 10. The recording unit 2 is provided with a carriage 4 having two recording heads 3A and 3B arranged in a row, and a drive unit 5 having a motor or the like for driving the carriage 4. Although not specifically shown, the carriage 4 is supported on a frame provided with a guide plate. When the drive unit 5 is driven, the carriage 4 is guided by the guide plate to reciprocally move in a direction crossing the substrate 10. In addition, a substrate-transporting unit (not shown in the drawing) is arranged at a position below the guide plate to transport (feed) the substrate 10.

The two recording heads 3A and 3B are arranged in a row in a reciprocal direction in which the carriage 4 reciprocally moves (left and right direction in the sheet surface of the FIG. 1; direction indicated by an arrow in FIG. 1). The recording heads 3A and 3B are provided with liquid-droplet jetting nozzles 6A and 6B, respectively. The jetting nozzles (hereinafter referred to as "nozzles") 6A and 6B jet liquids (first liquid L1, second liquid L2), respectively, and provided on the side of the lower surfaces of the recording heads 3A and 3B, respectively. Printing is performed on the substrate 10 by jetting the liquids in a downward direction from the nozzle 6A of the recording head 3A and from the nozzle 6B of the recording head 3B while the carriage 4 moves reciprocally. One of the two nozzles, which is provided on the recording head 3A among the two recording heads 3A and 3B, is the first nozzle 6A for jetting the first liquid L1; and the other of the two nozzles, which is provided on the recording head 3B among the two recording heads 3A and 3B, is the second nozzle 6B for jetting the second liquid L2. The jetting system for jetting the liquids is not specifically limited, and it is allowable to apply a system usually used for an ink-jet apparatus such as a piezo system, a thermal head system, or the like.

Liquid supply units 7A and 7B are connected to the recording head 3A and 3B via tubes 8A and 8B, respectively. Each of the liquid supply units 7A and 7B has a tank for supplying one of the first and second liquid L1 and L2 to one of the recording heads 3A and 3B.

Among the liquids used for the printing, the first liquid L1 is an aqueous solution containing metal salts which form a composite-metal oxide. Examples of preferred metal salts include inorganic salts such as sulfate, nitrate, chloride salt and the like; and organic salts such as acetate, oxalate, citrate and the like. For example, when the target composite-metal oxide is lead zirconate titanate (PZT) which is a material for piezoelectric film, a solution containing titanium salt, zirconium salt and lead salt can be used as the first liquid L1.

On the other hand, the second liquid L2 is an aqueous solution containing a precipitant. As the precipitant, an alkaline substance such as aqueous ammonia or the like can be used. The second liquid L2 is adjusted so that a mixed liquid Lm, obtained by mixing the second liquid L2 with the first liquid L1, has a pH within a range at which a coprecipitate can be generated.

Note that a complexing agent, a pH-adjusting agent and/or the like may be added to the first liquid L1 as necessary. Further, concentration of each of the first and second liquids L1 and L2 may be appropriately set depending on the object, for example, and may be high-concentrated when a film of great thickness is desired, or may be low-concentrated when a film of small thickness is desired.

Further, as the substrate 10, a resin plate (resin sheet) or the like for a circuit board can be used. It is preferable that a plasma surface treatment with fluorine gas is performed, prior to the pattern formation, to the substrate 10 for a surface thereof on which a pattern is to be formed (landing surface 10A on which liquid droplets D1 and D2 of the first and second liquids L1 and L2 land, respectively). By this surface treatment, fluorine group is introduced to the surface of the substrate 10 on which the pattern is to be formed (pattern-formation surface), thereby enhancing liquid-repellent property on the pattern-formation surface. Accordingly, it is possible to control contact angles of the first and second liquids L1 and L2 depending on the material of which the substrate 10 is formed and/or the surface state of the substrate 10 so that wetting-spreading amount, by which the liquid droplets D1 and D2 wet and spread on the surface of the substrate 10 after landing thereon, to be a predetermined amount.

Figure 2:
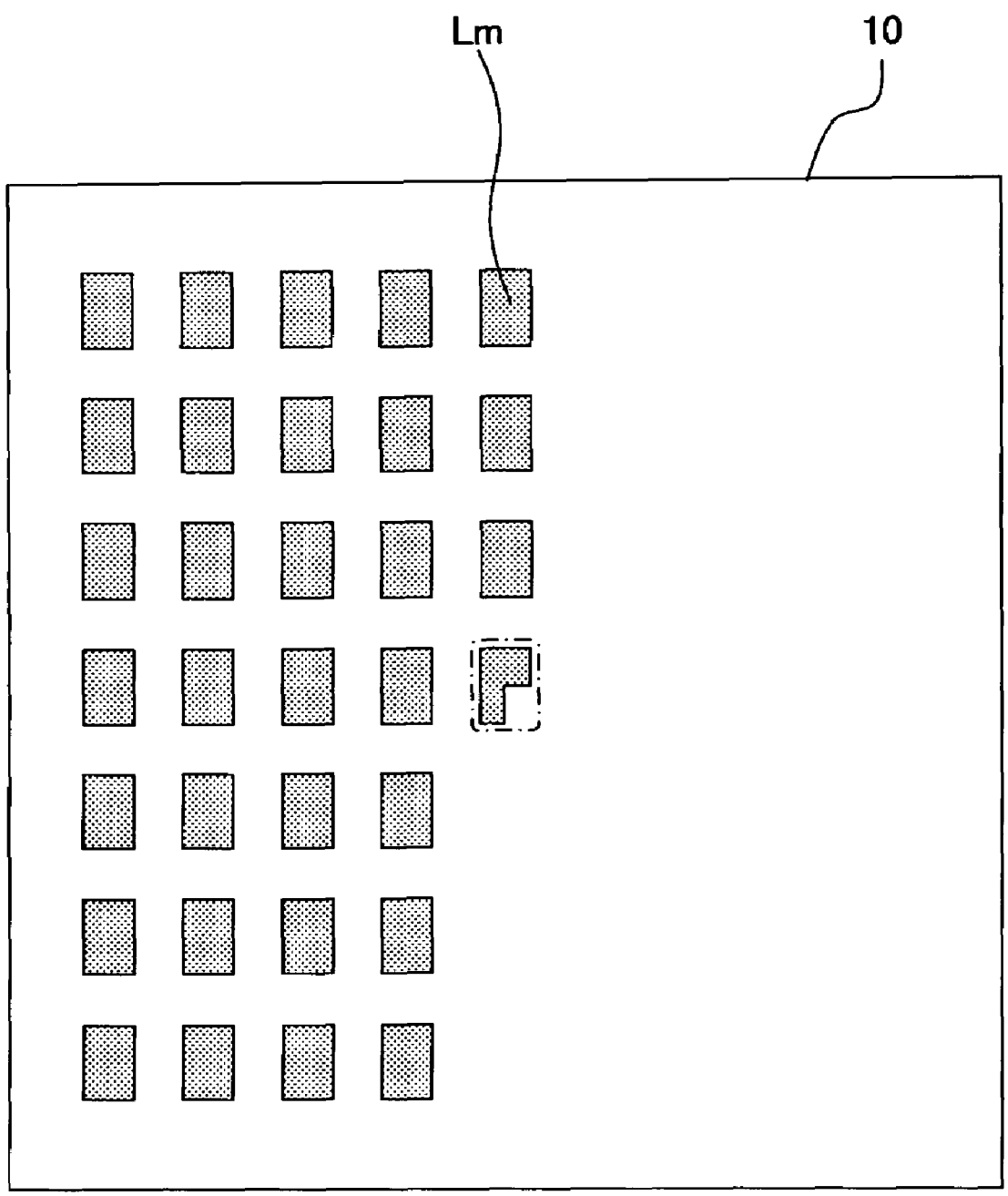
FIG. 2 is a top view showing an intermediate state in a step for forming a pattern on a substrate vertically and horizontally with a mixed liquid obtained by mixing first and second liquids.

In order to form the pattern on the substrate 10 by using the above-described printer 1, firstly, the first liquid L1 is filled in a tank of the liquid supply unit 7A connected to the recording head 3A which is one of the recording heads and is provided with the first nozzle 6A, and the second liquid L2 is filled in a tank of the liquid supply unit 7B connected to the recording head 3B which is the other of the recording heads and is provided with the second nozzle 6B. Next, while moving the carriage 4 by the drive unit 5 reciprocally in the direction crossing the substrate 10, the liquid droplets D1 and D2 are jetted from the nozzles 6A and 6B onto the substrate at positions at which elements are to be formed, thereby forming a pattern of the mixed liquid Lm of the first and second liquids L1 and L2. FIG. 2 shows a state in which the pattern of the mixed liquid Lm is being formed on the substrate 10 vertically and horizontally.

Figure 3:
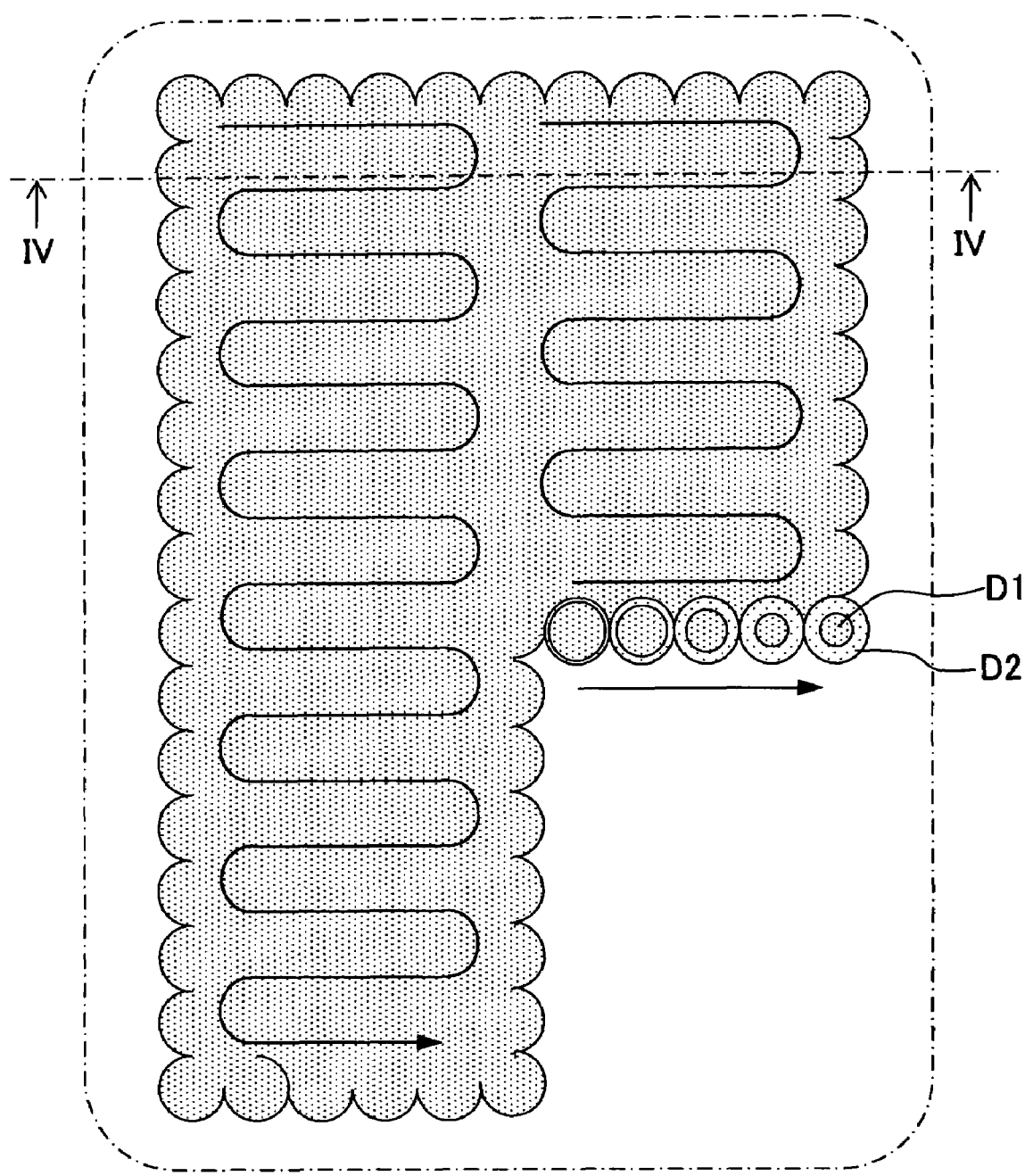
FIG. 3 is an enlarge view showing a portion of FIG. 2 surrounded by chain lines.
Figure 4:
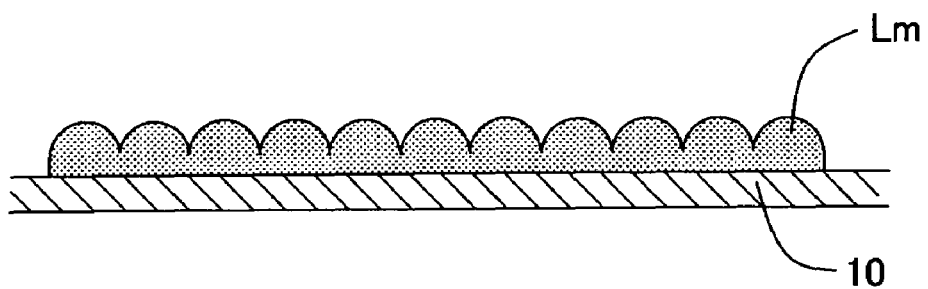
FIG. 4 is a cross sectional view of FIG. 3 taken along IV-IV line in FIG. 3.
Figure 5:
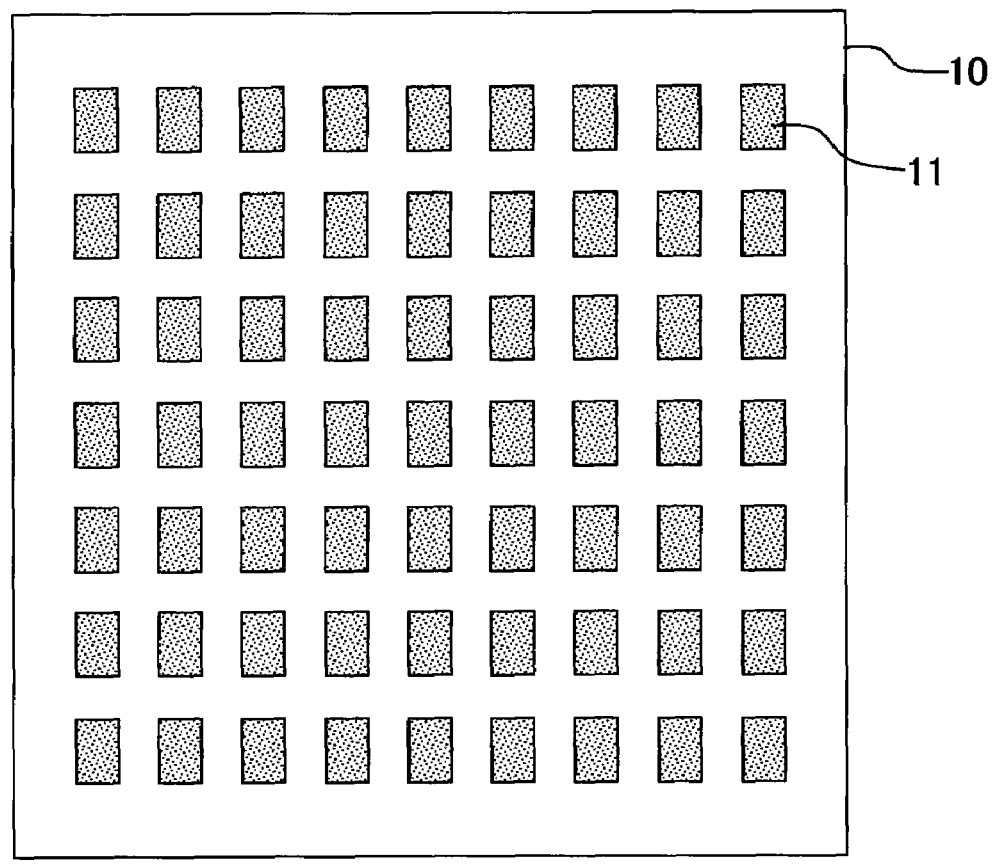
FIG. 5 is a top view showing a state that a pattern of a composite-metal oxide film is formed on a substrate vertically and horizontally.
Figure 6:
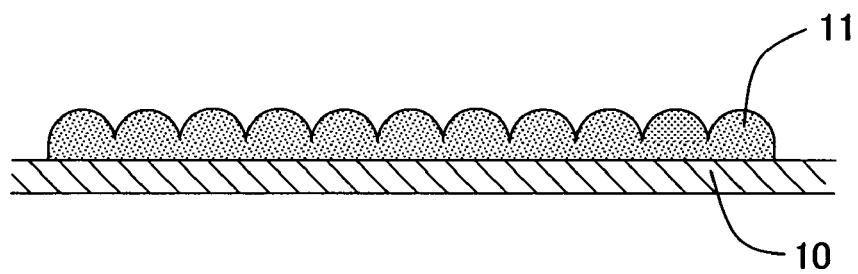
FIG. 6 is a partially enlarged cross-sectional view showing the substrate and the composite-metal oxide film.

Here, in one moving for one row of dots (one dot-row), both the first and second nozzles 6A and 6B jet the liquid droplets D1 and D2, respectively. FIG. 3 shows the state, in which the pattern of the mixed liquid Lm is being formed, in a partially enlarged manner. An arrow in the drawing indicates a relative moving route along which the nozzles 6A and 6B move relative to the substrate 10. The liquid droplet D1 of the first liquid L1 is jetted from the first nozzle 6A (first liquid jetting step); and the liquid droplet D2 of the second liquid L2 is jetted from the second nozzle 6B at a same position as a landing position at which the first liquid droplet D1 of the first liquid L1 has been landed (second liquid jetting step), thereby forming one dot. Namely, after performing the first liquid jetting step and the second liquid jetting step for a desired landing position, the first and second liquid jetting steps are repeated by changing the desired landing position to other landing positions different from the desired position. When the moving for forming one dot-row is completed, the substrate 10 is fed in a forward direction by a predetermined amount by the aid of the substrate-transporting unit, and the printing is performed for the next dot-row. This procedure is repeated so as to form a pattern in which the liquid droplets D1 of the first liquid L1 and the liquid droplet D2 of the second liquid L2 are jetted in an overlapping manner. At this time, the liquid droplets D1 of the first liquid L1 and the liquid droplet D2 of the second liquid L2, landed on the same positions, respectively, are mixed with each other and at least one of the metal salts contained in the first liquid L1 reacts with the precipitant contained in the second liquid L2, thereby forming a coprecipitate such as hydroxide.

Note that jetting amount of the first liquid L1 for forming one dot, and jetting amount of the second liquid L2 for forming one dot may be adjusted appropriately depending on the concentration or the like of each of the liquids L1 and L2. Further, although it is preferable that landing-time difference, between the first and second liquids L1 and L2 of which liquid droplets are jetted on a same position, is as small as possible, it is allowable to consider that the jetting-time difference is within a tolerance range when there is no harmful influence due to, for example, the drying of the liquid which landed firstly on the substrate.

After the pattern formation has been completed, water contained in the mixed liquid Lm on the substrate 10 is evaporated by a vacuum drying. Afterwards, the remaining coprecipitate is heated to generate a composite metal oxide (calcinating step). Accordingly, a composite-oxide metal film 11 having a predetermined pattern is formed on the substrate 10 (see FIGS. 5 and 6).

The flow of the process, in the first embodiment as described above, can be represented by a flow chart in FIG. 13. Namely, after performing the plasma surface treatment with fluorine gas (surface treatment step: S10), and then the first liquid L1 is jetted from the first nozzle 6A to land the first liquid L1 on a surface, of the substrate 10, for which the surface treatment has been performed (first liquid jetting step: S11). Afterwards, the second liquid L2, which reacts with the first liquid L1, is jetted from the second nozzle 6B so as to land the second liquid L2 at positions same as the landing positions at which the first liquid L1 has been landed in the first liquid jetting step S11 (second liquid jetting step: S12). Then finally, water contained in the mixed liquid Lm obtained by mixing the first and second liquid L1, L2 on the substrate 10 is evaporated by the vacuum drying, and the remaining coprecipitate is heated to generate a composite metal oxide (calcinating step: S13).

As described above, according to the embodiment, the liquid droplet D1 of the first liquid L1 and the liquid droplet D2 of the second liquid L2 are mixed with each other upon landing on the substrate 10, and the reaction between the liquid droplets D1 and D2 is initiated after the liquid droplets have been landed on the substrate 10. Therefore, it is possible to avoid problem which would be otherwise caused by mixing two kinds of liquids L1 and L2 prior to the usage.

Namely, in a case that the first and second liquid L1 and L2 are mixed in advance, the reaction between the metal salts and the precipitant is advanced also during a period of time from the mixture of the liquids and then to the coating thereof on the substrate 10. Therefore, there is need to shorten the time from the mixture to the coating as much as possible. However, in this the embodiment, there is no step for mixing the liquids in advance before the usage, thereby eliminating the necessity to consider the time from mixing to coating. Accordingly, the production process can be simplified. Further, for example, when the first liquid L1 and the second liquid L2 are mixed beforehand so as to obtain a film of substantial thickness, then there is problem that if the solutions to be mixed are high-concentrated, then the coprecipitate is aggregated and deposited, which in turn lowers the dispersion stability. On the other hand, when the solutions to be mixed are low-concentrated so as to enhance the dispersion stability, then there is a need to perform the coating repeatedly, which in turn lowers the productivity. In the embodiment, however, does not mix the first liquid L1 and the second liquid L2 in advance before the usage. Accordingly, solutions with a concentration appropriate depending on the object can be prepared and used.

Moreover, by reacting, on the substrate 10, the metal salt contained in the first liquid L1 and the precipitant contained in the second liquid L2, it is possible to form fine particles with nano-scale particles size without giving any time for particles of a reaction product to aggregate. These fine particles can be sufficiently calcinated at a low temperature, and thus are suitable for forming dielectric elements on a substrate made of a material such as resin having a low-thermal resistance.

Since the embodiment employs the ink-jet system, it is possible to perform fine control on liquid-jetting amount and/or landing position, thereby making it possible to land the first and second liquid L1 and L2 precisely on same landing positions. This is therefore advantageous for forming a highly dense or integrated pattern. In addition, a mixture ratio of the first and second liquids L1 and L2 can be finely controlled, thereby making it possible to stabilize the quality of the film 11.

Furthermore, in one moving for forming one dot-row, both the first and second nozzles 6A and 6B jet the liquid droplets D1 and D2, respectively, and there is hardly landing-time difference between the liquid droplets D1 and D2. Accordingly, it is possible to avoid that the first liquid droplets D1 of the first liquid L1 or the second liquid droplets D2 of the second liquid L2, which land first on the substrate, from decomposing singly.

Moreover, before performing the printing by the printer 1, the plasma surface treatment with fluorine gas is performed for the substrate 10 on the landing surface 10A thereof on which the liquid droplets D1 and D2 of the first and second liquid L1 and L2, respectively, are to be landed. This enhance the liquid repellent property on the landing surface 10A, thereby suppressing the wetting and spreading amount of the first and second liquid L1 and L2 within a predetermined amount. This makes it possible to mix the first liquid L1 and the second liquid L2 assuredly.

Note that when a piezoelectric material such as lead zirconate titanate (PZT) or the like is selected as the target complex metal oxide, it is possible to produce a piezoelectric actuator having satisfactory characteristics easily and precisely.

In the following, a second embodiment of the present invention will be explained with reference to FIGS. 7 to 10 and FIG. 13. In this embodiment, the present invention is applied to a method for forming, on a substrate 10 for printed circuit board by using a printer 1, a pattern of an adhesive 12 for adhering electronic parts. Structure and/or components same as those in the first embodiment are designated with same reference numerals, and explanation therefor will be omitted.

The adhesive 12 used in this embodiment is a two-liquid reaction curing type adhesive which is epoxy resin-based, for example. The adhesive 12 is obtained by mixing a curing agent and a main agent which is composed of epoxy resin, thereby chemically inducing the curing reaction between the main agent and the curing agent. The printer 1 used in the embodiment is same in structure as that used in the first embodiment. Further, among liquids used for the printing, a first liquid L1 contains a main agent for composing the two-liquid reaction curing type adhesive, and a second liquid L2 contains a curing agent for composing the two-liquid reaction curing type adhesive. Furthermore, as the substrate 10, a resin plate or the like used for a circuit board can be used. It is preferable that a plasma surface treatment with oxygen is performed, prior to the pattern formation, to the substrate 10 for a surface thereof on which a pattern is to be formed (pattern-formation surface). By this surface treatment, the pattern-formation surface of the substrate 10 is radicalized, thereby making it possible to activate the reaction between the pattern-formation surface and the adhesive 12.

Figure 7:
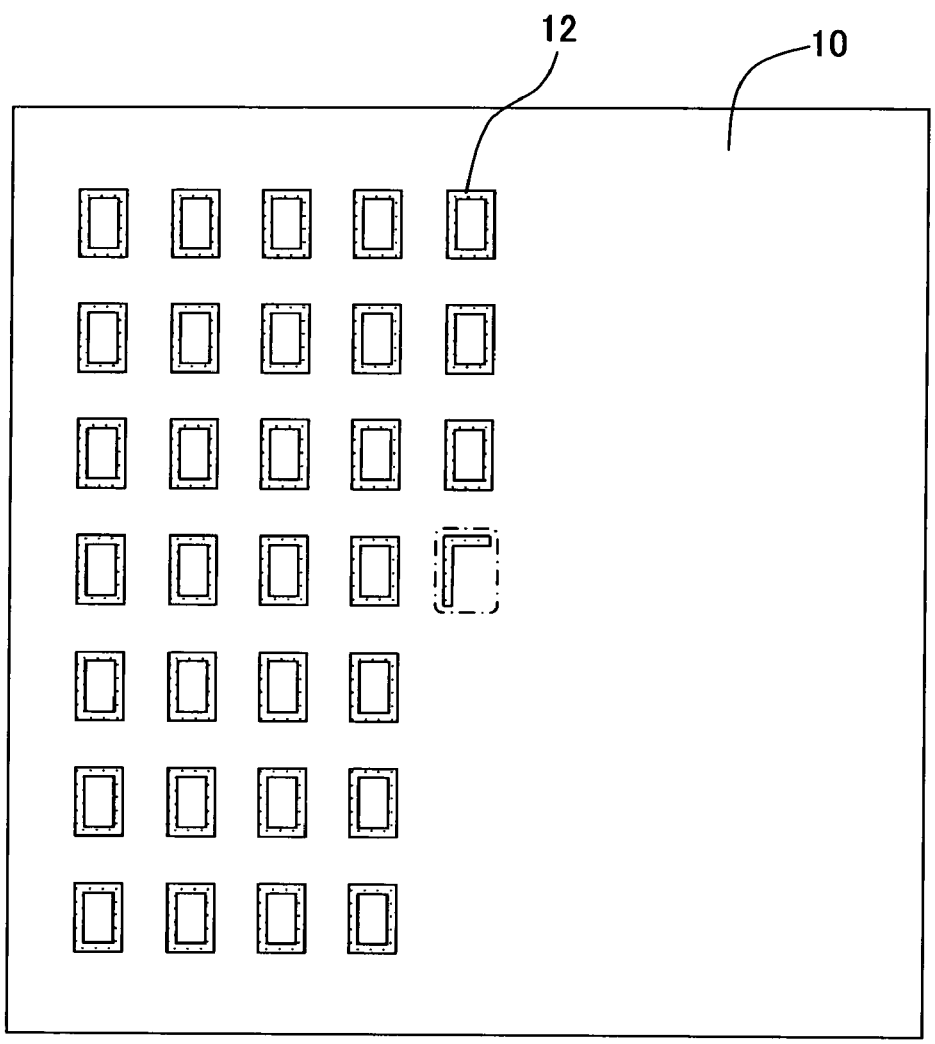
FIG. 7 shows a top view showing, in a second embodiment, an intermediate state in a step for forming an adhesive pattern on a substrate vertically and horizontally.
Figure 8:
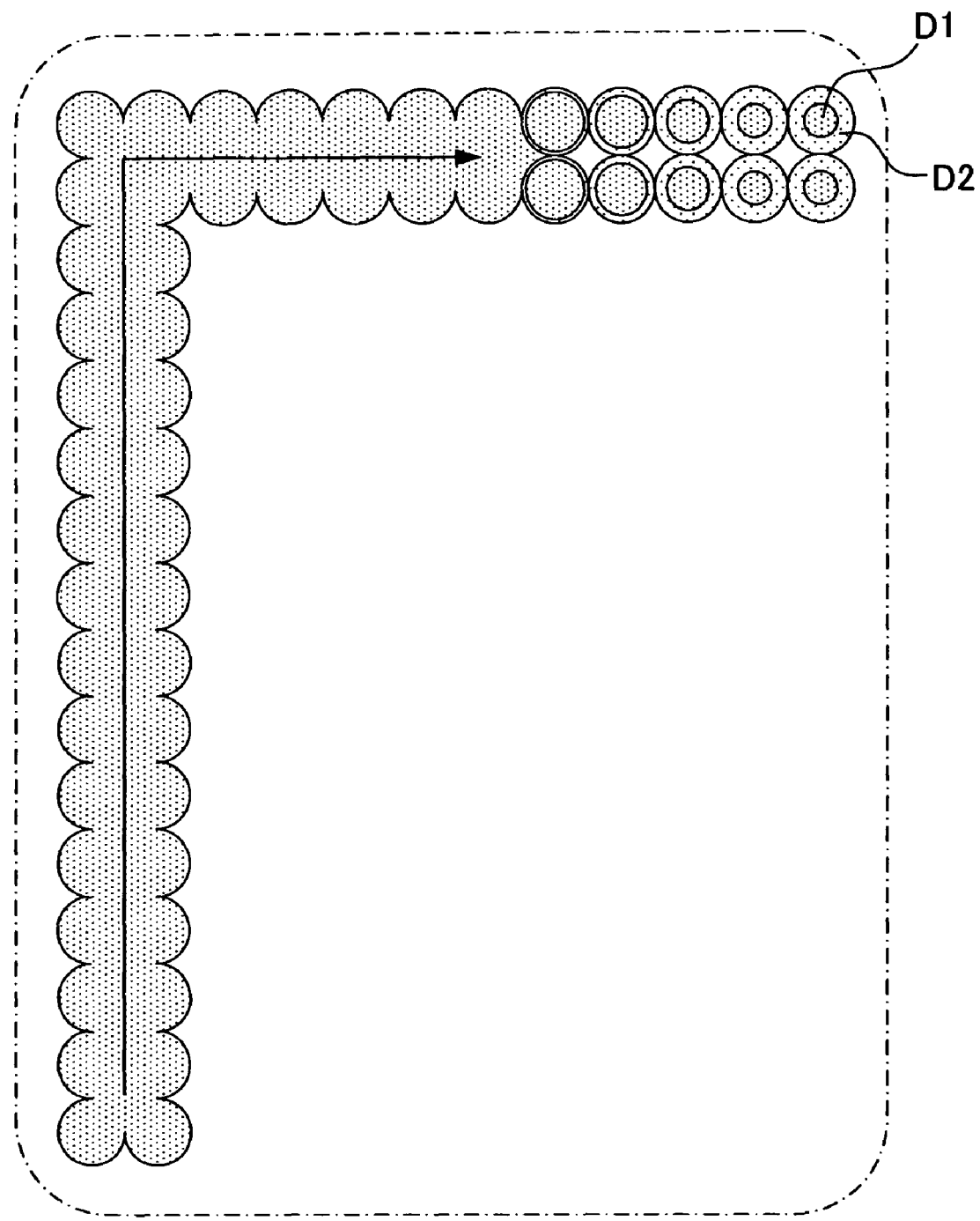
FIG. 8 is an enlarge view showing a portion of FIG. 7 surrounded by chain lines.

In order to coat the adhesive 12 on the substrate 10 by using the printer 1, firstly, the first liquid L1 (main agent) is filled in a tank of the liquid supply unit 7A connected to the recording head 3A which is one of the recording heads and is provided with the first nozzle 6A, and the second liquid L2 (curing agent) is filled in a tank of the liquid supply unit 7B connected to the recording head 3B which is the other of the recording heads and is provided with the second nozzle 6B. Next, while moving the carriage 4 by the drive unit 5 reciprocally in a direction crossing the substrate 10 similarly to the first embodiment, the liquid droplets D1 and D2 are jetted onto the substrate at positions at which electronic parts 13 are to be mounted, thereby forming a pattern of the adhesive 12 in which the liquid droplets D1 of the first liquid L1 and the liquid droplets D2 of the second liquid L2 are jetted in an overlapping manner (see FIGS. 7 and 8). FIGS. 7 and 8 show a state in which frame-shaped pattern of the adhesive 12 is formed on the substrate 10 at positions in each of which one of the electronic parts 13 is to be mounted, along the circumferential edge of the electronic part 13.

At this time, similarly in the first embodiment, in one moving for forming one dot-row, both the first and second nozzles 6A and 6B jet the liquid droplets D1 and D2, respectively. Namely, the liquid droplet D1 of the first liquid L1 is jetted from the first nozzle 6A (first liquid jetting step), and the liquid droplet D2 of the second liquid L2 is jetted from the second nozzle 6B at a same position as the landing position at which the liquid droplet D1 of the first liquid L1 has been landed (second liquid jetting step), so as to form one dot. In other words, after performing the first liquid jetting step and the second liquid jetting step for a desired landing position, the first and second liquid jetting steps are repeated by changing the landing position to other landing positions different from the desired position. When the moving for forming one dot-row is completed, the substrate 10 is fed in a forward direction by a predetermined amount by the aid of the substrate-transporting unit, and then the printing is performed for the next dot-row. This procedure is repeated so as to form element patterns in each of which the liquid droplets D1 of the first liquid L1 and the liquid droplets D2 of the second liquid L2 are jetted in an overlapping manner. Then, the liquid droplets D1 of the first liquid L1 and the liquid droplets D2 of the second liquid L2 landed on same landing positions, respectively, are mixed with each other to thereby initiate the curing reaction.

Figure 9:
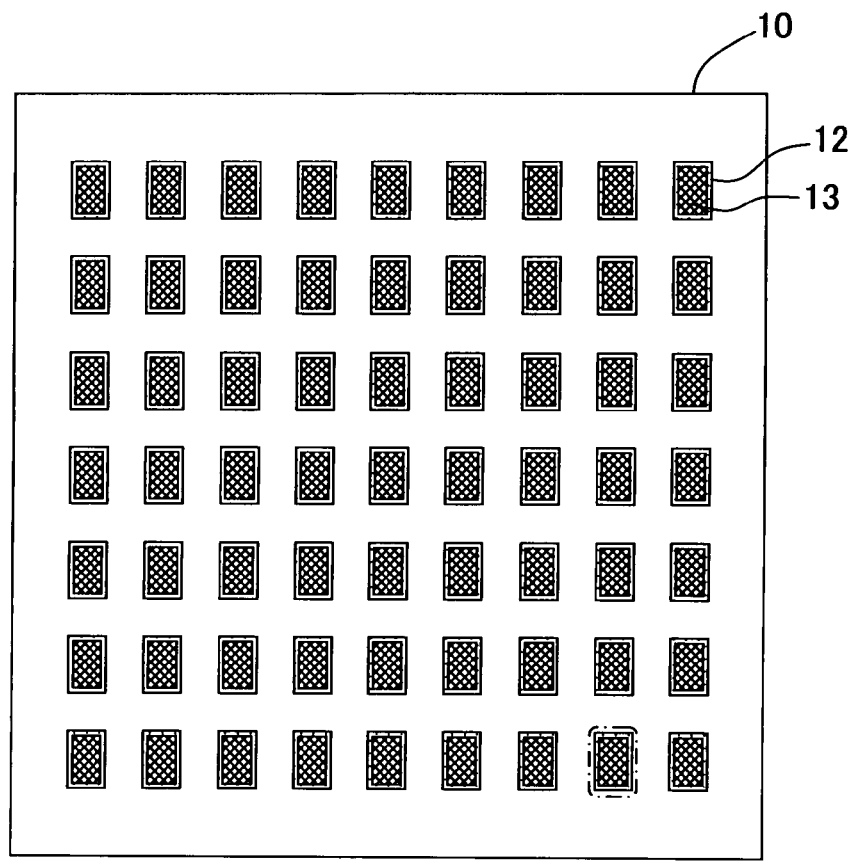
FIG. 9 is a top view showing a state that electronic parts are mounted on the substrate by positioning the electronic parts in accordance with the positions of the formed pattern.
Figure 10:
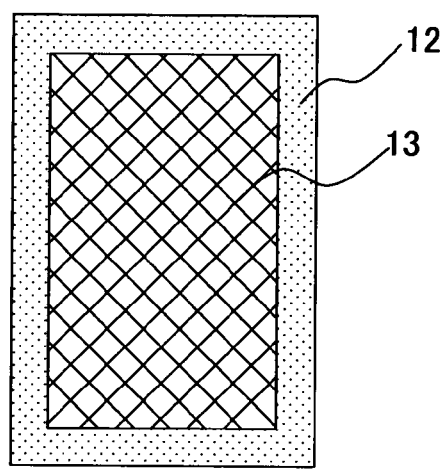
FIG. 10 is an enlarged view showing a portion of FIG. 9 surrounded by chain lines.

After the pattern formation has been completed, the electronic parts 13 are mounted or placed on positions at which the adhesive 12 are coated (see FIGS. 9 and 10). Then, the adhesive 12 is cured completely at a normal temperature or by heating, thereby firmly fixing the electronic parts 13 on the substrate 10.

Figure 13:
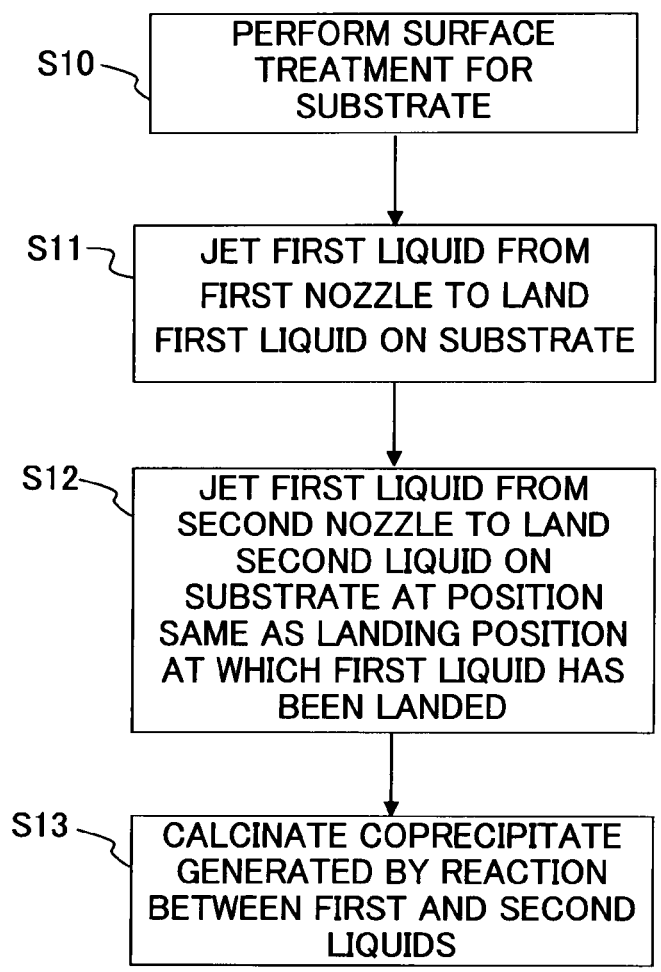
FIG. 13 is a flow chart showing a process in the present invention.

The flow of the process, in the second embodiment as described above, can be represented by the flow chart in FIG. 13. Namely, after performing the plasma surface treatment with oxygen (surface treatment step: S10), and then the first liquid L1 is jetted from the first nozzle 6A to land the first liquid L1 on a surface, of the substrate 10, for which the surface treatment has been performed (first liquid jetting step: S11). Afterwards, the second liquid L2, which reacts with the first liquid L1, is jetted from the second nozzle 6B so as to land the second liquid L2 at positions same as the landing positions at which the first liquid L1 has been landed in the first liquid jetting step S11 (second liquid jetting step: S12). In the second embodiment, instead of the calcinating step S13 explained in the first embodiment, a process is performed to overwrap (overlay) the electronic parts 13 at the landing positions of the first and second liquids L1, L2, respectively, then to cure the adhesive 12 at normal temperature or by performing heating, thereby fixing the electronic parts 13 firmly on the substrate 10.

As described above, according to the embodiment, the first liquid L1 containing the main agent and the second liquid L2 containing the curing agent are made to mix with each other when the liquid droplet D1 of the first liquid L1 and the liquid droplet D2 of the second liquid L2 are landed onto the substrate, and the reaction between the first and second liquid droplets D1 and D2 of the first and second liquids L1 and L2 are initiated after the liquid droplets D1 and D2 have landed on the substrate. Accordingly, it is possible to avoid any disadvantage which would be otherwise caused by mixing the two liquids L1 and L2 prior to the usage. Namely, in a case that the first and second liquid L1 and L2 are mixed in advance, the curing reaction between the main and curing agents is advanced also during a period of time from the mixture of the agents and then to the coating thereof on the substrate 10. Therefore, there is need to provide a washing (cleaning) mechanism to prevent the adhesive 12 from solidifying inside the liquid-droplet jetting nozzles to thereby clog the nozzles; and/or that there is a restriction that the liquids, once mixed with each other, should be used up in only one usage. However, in the method of the embodiment, the main and curing agents are isolated from each other inside the liquid-droplet jetting apparatus, and thus no solidification occurs. Accordingly, the maintenance is simple and there is less restriction in the process because the liquids do not need to be used up in one usage.

In addition, since the embodiment adopts the ink-jet system, it is possible to precisely control the coating position required upon mounting electronic parts on the substrate.

In the following, the present invention will be explained further in detail by an example (first example) in which a composite metal-oxide film is formed on a substrate.

(1) Preparation of First Liquid 24 ml of a 1 mol/L-titanium nitrate solution was mixed with 6 ml of a 50%-hydrogen peroxide solution as complexing agent, thereby preparing a solution containing titanium salt. 24 ml of a 1 mol/L-zirconyl nitrate solution was mixed with 6 ml of a 50%-hydrogen peroxide solution as complexing agent, thereby preparing a solution containing zirconium salt. 48 ml of a 1 mol/L-lead nitrate-containing solution was prepared. The above-described three kinds of solutions are mixed to prepare a mixed liquid containing metal salts (metal salts-containing mixed liquid). In addition, for the purpose of low-temperature crystallization, 10 g of a block copolymer $EO_{20}$-$PO_{70}$-$EO_{20}$ based on ethylene oxide (EO) and propylene oxide (PO) (PLURONIC P123™, produced by BASF Aktiengesellschaft) was dissolved in water to prepare 30 ml of a block-copolymer solution. The metal salts-containing mixed liquid and the block-copolymer solution as described above were mixed to obtain a first liquid.

(2) Preparation of Second Liquid 3 g of ammonium sulfate as precipitant was dissolved in 50 ml of 3 mol/L-liquid ammonia to obtain a second liquid.

(3) Substrate

A multi-layered printed circuit board mainly formed of a polyimide-based resin was used as the substrate, and a surface of the substrate was subjected to a plasma surface treatment using fluorine-containing gas.

(4) Formation of Complex-Metal Oxide Film

An ink-jet type liquid-droplet jetting apparatus, having the structure as described in the embodiment, was prepared. The first and second liquids prepared in the above (1) and (2) were filled in tanks respectively. Then, a pattern was formed under the conditions that a landing-time difference between the first and second liquids was 0 (zero) second; and that liquid-droplet volume ratio of the first liquid to that of the second liquid was 1:1. Afterwards, the formed pattern of coprecipitate was subjected to vacuum drying at 100° C. for 8 hours so as to remove excess solvent and temporarily settle (fix) the coprecipitate to the surface of the substrate. After performing the drying, the pattern of coprecipitate was heated at about 300° C. for 60 minutes to be calcinated, thereby successively obtaining a pattern of complex metal oxide. At this time, perovskite phase was formed at the low temperature calcination by the presence of the block copolymer P-123.

In the following, the present invention will be explained by an example (second example) regarding the method for coating two-liquid reaction curing type adhesive.

(1) Materials

AP-209A (produced by TOAGOSEI CO., LTD.), which is the main agent of an epoxy-based, two-liquid reaction curing type adhesive, was used as the first liquid. AP-209B (produced by TOAGOSEI CO., LTD.), which is a curing agent, was used as the second liquid. A substrate mainly formed of epoxy-based resin was used as the substrate, and a surface of the substrate was subjected to a plasma surface treatment with oxygen.

(2) Adhesion of Electronic Parts onto the Substrate

An ink-jet type liquid-droplet jetting apparatus, having the structure as described in the embodiment, was prepared. The first liquid (main agent) and the second liquid (curing agent) described in the above (1) were filled in tanks respectively. Then, a pattern of an adhesive was formed at positions to which electronic parts were to be fixed, under the conditions that a landing-time difference between the first and second liquids was 0 (zero) second; and that liquid-droplet volume ratio of the first liquid to that of the second liquid was 2:1. Afterwards, the electronic parts were placed on the formed pattern of the adhesive, followed by being subjected to a pre-curing at 30° C. for 60 minutes. Thereafter, the pattern was completely cured at room temperature or by heating, thereby adhering the electronic parts on the substrate.

Although the present invention has been specifically explained as above, the present invention is not limited to the embodiments and/or examples, and may be modified and/or add changes within the scope of the claims. For example, in the first embodiment all the metal salts as the materials are contained in the first liquid L1. However, it is allowable that a metal salt, among the metal salts, which does not singly react with the precipitant, is contained in the second liquid.

Figure 11:
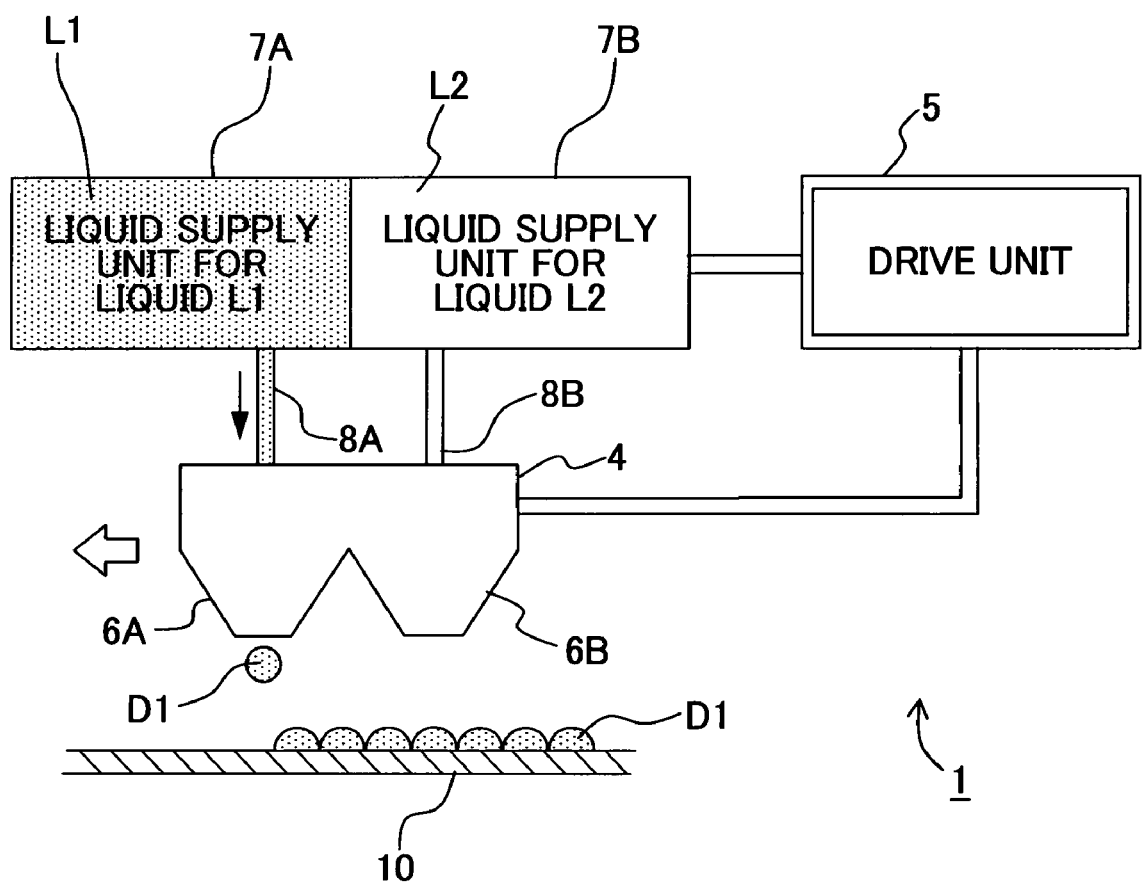
FIG. 11 is a schematic side view showing a state, in another embodiment, that first liquid is being landed on the substrate by moving the nozzles for the first count.
Figure 12:
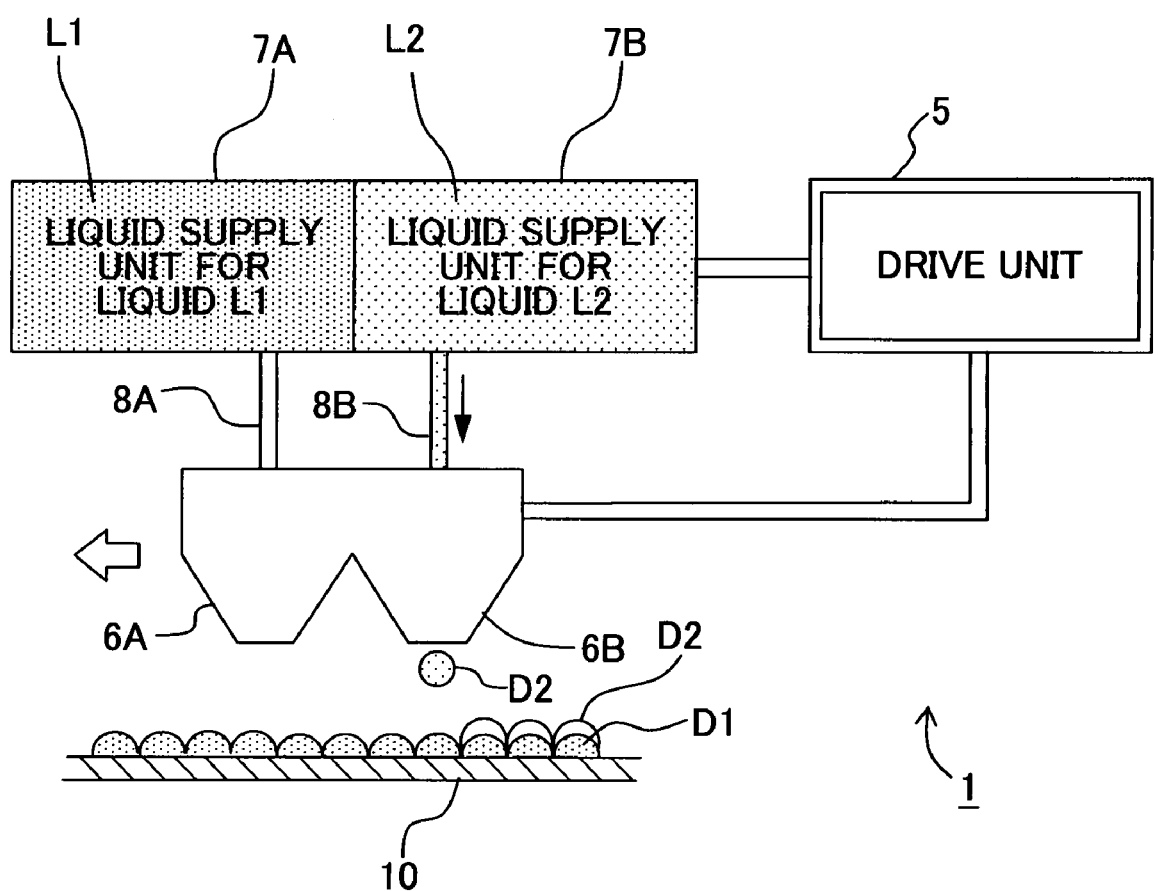
FIG. 12 is a schematic side view showing a state, in the another embodiment, that second liquid is being landed on the substrate, by moving the nozzles for the second count, at positions same as landing positions at which the first liquid has been landed, respectively.

In the above-described embodiments, both the first and second liquids L1 and L2 are jetted from the nozzles 6A and 6B, respectively, in one moving. However, procedure for overlaying the first and second liquids L1 and L2 is not limited to those in the embodiments. For example, as shown in FIGS. 11 and 12, it is allowable that the carriage 4 moves twice for forming one dot-row such that the liquid droplets D1 of the first liquid L1 are jetted for the first moving of the carriage among the two movement (first liquid jetting step), and the liquid droplets D2 of the second liquid L2 are jetted, during the second moving of the carriage among the two movement, to be landed and overlaid at positions same as those at which the liquid droplets D1 have been landed respectively (second liquid jetting step). Alternatively, the liquid droplets D1 of the first liquid L1 may be jetted when the carriage 4 moves in an outgoing route of its reciprocal movement (first liquid jetting step); and the liquid droplets D2 of the second liquid L2 may be jetted, at positions which are same as those at which the liquid droplets D1 of the first liquid L1 have been landed respectively, when the carriage moves in a returning route of its reciprocal movement (second liquid jetting step). Still alternatively, it is allowable to reverse the order in which the first liquid L1 and the second liquid L2 are jetted. It should be noted, however, that a tolerance for the landing-time difference is preferably determined by considering the influence exerted by concentration change due to the evaporation of the solvent from liquid droplets of one of the liquids which first land on the substrate, and/or the like.

The combination of first and second liquids is not limited to those of the above-described embodiments, and various combinations may be adopted. For example, for the purpose of forming a ferromagnetic film (ferrite plating) on a substrate, it is possible to combine an oxidizing liquid ($NaNO_2$) and a reaction liquid ($FeCl_2$+$MCl_2$). For the purpose of forming a film made of a reactive curable type coating material, remedial agent or resin, a combination of a main agent and a curing agent may be used. For the purpose of forming a coating film made of an inorganic coating agent such as glass coating agent or the like, it is possible to combine a main agent and a catalyst; and for the purpose of forming a layer of thermal-insulating resin by foam curing, it is possible to use a combination of a main agent and a curing agent.

The present invention is not limited to the application to the two-liquid mixture system. For example, when the present invention is applied to a triple mixture system, it is allowable to provide, to the ink-jet type liquid-droplet jetting apparatus having two liquid-droplet jetting nozzles, an additional liquid-droplet jetting nozzle; and to jet liquid droplets of a third liquid from this additional liquid-droplet jetting nozzle so that the liquid droplets of the third liquid land at positions same as those at which the liquid droplets of the first and second liquids have been landed. Further, also for a mixture system of not less than four liquids, it is allowable to additionally provide liquid-droplet jetting nozzles in an number required for the number of liquids and to jet liquid droplets from the added liquid-droplet jetting nozzles so that the liquid droplets are landed at positions same as those at which the liquid droplets of the first and second liquids have been landed.

The present invention is applicable further to a case when a film of substantial thickness is to be formed. For example, the first and second liquids are jetted to be mutually reacted on the substrate, thereby forming a pattern of coprecipitate. The formed pattern is then subjected to the vacuum drying. Afterwards, the first and second liquids are jetted again onto the formed pattern so as to form another pattern of the coprecipitate, followed by being subjected to the vacuum drying. This process can be repeated to thereby form a film of substantial thickness. In this case, whereas the first layer (layer of the coprecipitate pattern) is formed on the substrate for which the surface treatment has been performed, the second and subsequent layers are formed on the coprecipitate layer which has been already formed. Accordingly, there is need to adjust the concentration of the solution used upon forming the first layer and forming the second and subsequent layers. The resulting film with substantial thickness can be used, for example, as a piezoelectric film for an ink-jet head.

Figure 14:
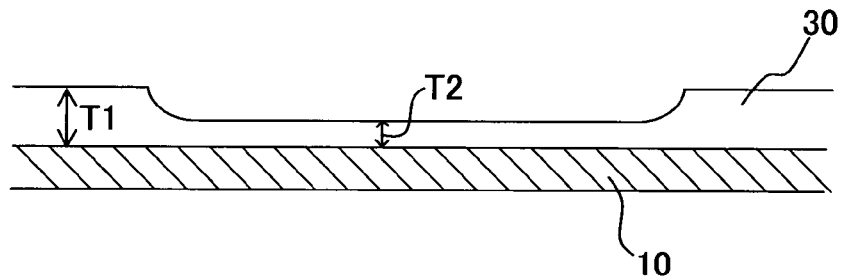
FIG. 14 is an enlarged sectional view partially showing a film formed in still another embodiment of the present invention.

Further, since the present invention can precisely control the liquid-droplet amount and the landing position thereof by using the ink-jet type liquid droplet jetting apparatus, the present invention is applicable to a case for forming, for example as shown in FIG. 14, a film 30 which includes a great-thickness portion T1 having a substantial thickness and a small-thickness portion T2 having a thickness smaller than that of the great-thickness portion T1. For example, by changing, for each of the landing positions, a number of times in which a pattern of coprecipitate is additionally formed on the pattern of coprecipitate which has been already formed, it is possible to form the great-thickness and small-thickness portions T1 and T2 in the film. Alternatively, the great-thickness and small-thickness portions T1 and T2 can be formed also by changing the liquid-droplet amount for each of the landing positions.

What is claimed is:

1. A method for forming a composite-metal oxide film on a base material by using a liquid-droplet jetting apparatus of an ink-jet type including: a carriage which is reciprocally movable in a reciprocal direction and which has a first nozzle and a second nozzle arranged in the reciprocal direction with a predetermined space therebetween; and a transporting unit which feeds the base material, the method comprising:

a first liquid jetting step for jetting, from the first nozzle, a first liquid containing salts of metals forming a composite metal oxide to land the first liquid on the base material while moving the carriage in the reciprocal direction;

a second liquid jetting step for jetting, from the second nozzle, a second liquid containing a precipitant, which reacts with at least one of the metals forming the composite metal oxide to form a coprecipitate, to land the second liquid on the base material at a same position as a landing position at which the first liquid has been landed in the first liquid jetting step while moving the carriage in the reciprocal direction, and for mixing the first and second liquids on the base material;

a feeding step for feeding the base material in a direction perpendicular to the reciprocal direction after the first liquid jetting step and the second liquid jetting step;

a drying step for evaporating water contained in a mixed liquid of the first and second liquids on the base material; and a calcinating step for calcinating a coprecipitate, generated by the mixing of the first and second liquids, to form the composite-metal oxide film on the base material after the drying step.

2. The method for forming the composite-metal oxide film according to claim 1, further comprising:

a surface treatment step, performed before the first liquid jetting step and the second liquid jetting step, for enhancing a liquid repellent property on a landing surface, of the base material, onto which the first and second liquids are to be landed.

3. The method for forming the composite-metal oxide film according to claim 1;

wherein the first liquid jetting step and the second liquid jetting step are performed concurrently.

4. The method for forming the composite-metal oxide film according to claim 1;

wherein the first liquid jetting step and the second liquid jetting step are repeated, after the first liquid jetting step and the second liquid jetting step have been performed for the landing position, while changing the landing position to other landing positions different from the landing position.

5. The method for forming the composite-metal oxide film according to claim 1;

wherein the composite-metal oxide film is a piezoelectric film constructing a piezoelectric actuator.

6. The method for forming the composite-metal oxide film according to claim 1;

wherein the composite metal oxide is lead zirconate titanate.

7. The method for forming the composite-metal oxide film according to claim 1;

wherein the second liquid includes a solution in which ammonium sulfate is dissolved in liquid ammonia.

8. The method for forming the composite-metal oxide film according to claim 1;

wherein the first liquid includes aqueous solution of a block copolymer.

9. The method for forming the composite-metal oxide film according to claim 1;

wherein, in one movement of the carriage in the reciprocal direction, both the first liquid jetting step and the second liquid jetting step are performed with a predetermined jetting-time difference so that the first liquid landed on the base material at the landing position in the first liquid jetting step is not dried before the second liquid jetted in the second liquid jetting step lands on the base material at the landing position of the first liquid.

10. The method for forming a composite-metal oxide film according to claim 1;

wherein the first liquid jetting step and second liquid jetting step are repeated, after the first liquid jetting step and second liquid jetting step have been performed for the landing position, while changing the landing position to other landing positions different from the landing position in the reciprocal direction, to form one dot-row on the base material; and wherein the feeding step is performed after the one-dot row has been formed on the material.

11. A method for forming a composite-metal oxide film on a base material by using a liquid-droplet jetting apparatus of an ink-jet typed including a carriage which is reciprocally movable in a first direction and a second direction opposite to the first direction and which has a first nozzle and a second nozzle arranged in the first direction with a predetermined space therebetween, the method comprising:
- a first liquid jetting step for jetting, from the first nozzle, a first liquid containing salts of metals forming a composite metal oxide to land the first liquid on the base material while moving the carriage in the first direction; and
- a second liquid jetting step for jetting, from the second nozzle, a second liquid containing a precipitant, which reacts with at least one of the metals forming the composite metal oxide to form a coprecipitate, to land the second liquid on the base material at a same position as a landing position at which the first liquid had been landed in the first liquid jetting step while moving the carriage in the second direction, and for mixing the first and second liquids on the base material.

12. A method for forming a composite-metal oxide film on a base material by using a liquid-droplet jetting apparatus of an ink-jet type including a carriage which is reciprocally movable in a first direction and a second direction opposite to the first direction and which has a first nozzle and a second nozzle arranged in the first direction with a predetermined space therebetween, the method comprising:
- a first liquid jetting step for jetting, from the first nozzle, a first liquid containing salts of metals forming a composite metal oxide to land the first liquid on the base material while moving the carriage in first direction;
- a returning step for moving the carriage in the second direction after the first liquid jetting step without jetting any liquid from the first nozzle and the second nozzle; and
- a second liquid jetting step for jetting, from the second nozzle, a second liquid containing a precipitant, which reacts with at least one of the metals forming the composite metal oxide to form a coprecipitate, to land the second liquid on the base material at a same position as a landing position at which the first liquid has been landed in the first liquid jetting step while moving the carriage in the first direction after the returning step, and for mixing the first and second liquids on the base material.

* * * * *